United States Patent [19]
Mukai

[11] Patent Number: 5,518,967
[45] Date of Patent: May 21, 1996

[54] PROCESS FOR PRODUCING A SEMICONDUCTOR DEVICE CAPABLE OF PLANARIZING A METAL FILM SURFACE THEREON

[75] Inventor: Ryoichi Mukai, Kawasaki, Japan

[73] Assignee: Fujitsu Limited, Kawasaki, Japan

[21] Appl. No.: 234,017

[22] Filed: Apr. 28, 1994

[30] Foreign Application Priority Data

Apr. 28, 1993 [JP] Japan .................... 5-101681

[51] Int. Cl.$^6$ .............................. H01L 21/465
[52] U.S. Cl. .................. 437/245; 437/187; 437/192; 437/195
[58] Field of Search .................... 437/195, 192, 437/245, 187, 247, 80; 117/107, 108

[56] References Cited

U.S. PATENT DOCUMENTS

| | | | |
|---|---|---|---|
| 4,495,221 | 1/1985 | Broadbent | 437/245 |
| 4,536,942 | 8/1985 | Chao et al. | 437/245 |
| 4,675,979 | 6/1987 | Lade et al. | 437/195 |
| 4,771,017 | 9/1988 | Tobin et al. | 437/245 |
| 4,824,544 | 4/1989 | Mikalesen et al. | 204/298 |
| 5,152,864 | 10/1992 | Ieki et al. | 117/108 |
| 5,238,525 | 8/1993 | Turner et al. | 117/107 |
| 5,374,592 | 12/1994 | MacNaughton et al. | 437/245 |

*Primary Examiner*—George Fourson
*Assistant Examiner*—Thomas G. Bilodeau
*Attorney, Agent, or Firm*—Armstrong, Westerman, Hattori, McLeland & Naughton

[57] ABSTRACT

A process of producing a semiconductor device, which includes the steps of: forming an insulating film on a substrate; then etching the insulating film to form an opening through which the substrate is exposed; and then irradiating a metal molecular beam through the opening to deposit a metal film on the substrate, the metal molecular beam being irradiated at an incident angle $\theta$ within a range of 5 deg $\leq \theta \leq \tan^{-1}$ (b/2a) deg ("a" and "b" being the depth and diameter of the opening, respectively) relative to the normal of the substrate.

9 Claims, 2 Drawing Sheets

PROCESS FOR PRODUCING A SEMICONDUCTOR DEVICE CAPABLE OF PLANARIZING A METAL FILM SURFACE THEREON

BACKGROUND OF THE INVENTION

1. Field of the Invention

The present invention relates to a process of producing or manufacturing a semiconductor device, specifically a process applicable to forming metal films used as conductor layers or other components of VLSIs or the like, particularly a process capable of planarizing the metal film surface by burying viaholes with metal without causing generation of voids in the viaholes even when a mass migration occurs in the metal film during annealing after deposition.

2. Description of the Related Art

A recent trend is to provide a VLSI with an improved performance including high speed, high density, and high reliability. The VLSI has conductor layers made of a metal film usually deposited by a PVD process. Improvement of the performance of a VLSI is achieved by forming conductor layers with a refined, multiple-layered, and planarized structure. A problem has arisen in that, particularly when the conductor width or the viahole size is reduced by the refinement, it becomes difficult to ensure a good coverage when forming conductor layers in viaholes.

Therefore, it has been desired to provide a process of producing a semiconductor device, that ensures a good coverage when forming conductor layers in viaholes and is also capable of burying viaholes with metal.

Conventionally, aluminum, which is most commonly used as a conductor material among metals, is deposited by sputtering. Particularly, viaholes are buried by a high temperature sputtering or a high temperature bias sputtering, in which the substrate temperature is raised to a temperature near the melting point of the metal being deposited to form a metal film.

Viaholes are also buried by another method in which a metal film deposited by a usual sputtering is temporarily melted by laser irradiation. Viaholes are alternatively buried by a method in which a selective CVD process or a blanket CVD process is combined with an etch-back process.

The above-recited conventional usual sputtering, however, has a problem that, when a viahole has a small diameter and an large depth or has a large aspect ratio (depth to diameter ratio), the amount of metal deposited on the side wall and the bottom of the viahole is far less than that deposited on the substrate portion outside the viahole. Moreover, at the open top of the viahole, the deposited metal forms an overhang to consequently block the viahole in the top. It is thus difficult to deposit metal in a viahole and a metal film formed in the viahole contains voids, i.e., it is difficult to provide good coverage when forming a metal film in a viahole.

Although the above-mentioned conventional high temperature sputtering or high temperature bias sputtering is advantageous over the usual sputtering in that an overhang is harder to form than the usual sputtering because the substrate is held at a high temperature during deposition of a metal film, it has the drawback that the high substrate temperature causes the deposited metal to easily form balls and makes it difficult to provide a continuous film. To suppress ball formation, the substrate temperature must be occasionally varied, so that the process is difficult to control and cannot be stably operated.

Although the herein first-recited process performing annealing after deposition at room temperature is advantageous in that viaholes can be buried by deforming the deposited metal by annealing, it still has the problem specific to the room temperature deposition process in that, with an increased aspect ratio of viaholes, the deposited metal forms an overhang at the viahole top and thereby makes it difficult to form a metal film in viaholes with a good coverage, with the result that, after the annealing, the viaholes have a blocked top and contain voids left therein.

The conventional selective CVD and blanket CVD processes have also a problem that, because a metal film is deposited through a reaction with a substrate surface, the deposition process is sensitive to the surface conditions of the substrate and is more expensive than the sputtering process.

SUMMARY OF THE INVENTION

The object of the present invention is to provide a process of producing a semiconductor device, whereby an increased aspect ratio of viaholes does not cause an overhang of deposited metal to be formed at the viahole top but allows a continuous metal film to be formed in the viaholes, and the viaholes can be buried by annealing after deposition, not leaving voids therein.

To achieve the above object according to the present invention, there is provided a process of producing a semiconductor device, comprising the steps of: forming an insulating film on a substrate; then etching the insulating film to form an opening through which the substrate is exposed; and then irradiating a metal molecular beam through the opening to deposit a metal film on the substrate, the metal molecular beam being irradiated at an incident angle $\theta$ within a range of 5 deg$\leq\theta\leq\tan^{-1}$ (b/2a) deg ("a" and "b" being the depth and diameter of the opening, respectively) relative to the normal of the substrate.

According to the present invention, the incident angle must not be less than 5 deg, because an incident angle less than 5 deg is practically undesirable in that it allows a metal film to be deposited on the bottom of an opening but fails to provide substantial deposition of a metal film on the side wall of an insulating film within the opening. The incident angle must not be greater than $\tan^{-1}$ (b/2a), because an incident angle greater than $\tan^{-1}$ (b/2a) is also practically undesirable in that a metal film is not completely deposited on the bottom of an opening.

DESCRIPTION OF THE PREFERRED EMBODIMENTS

Figure 1:
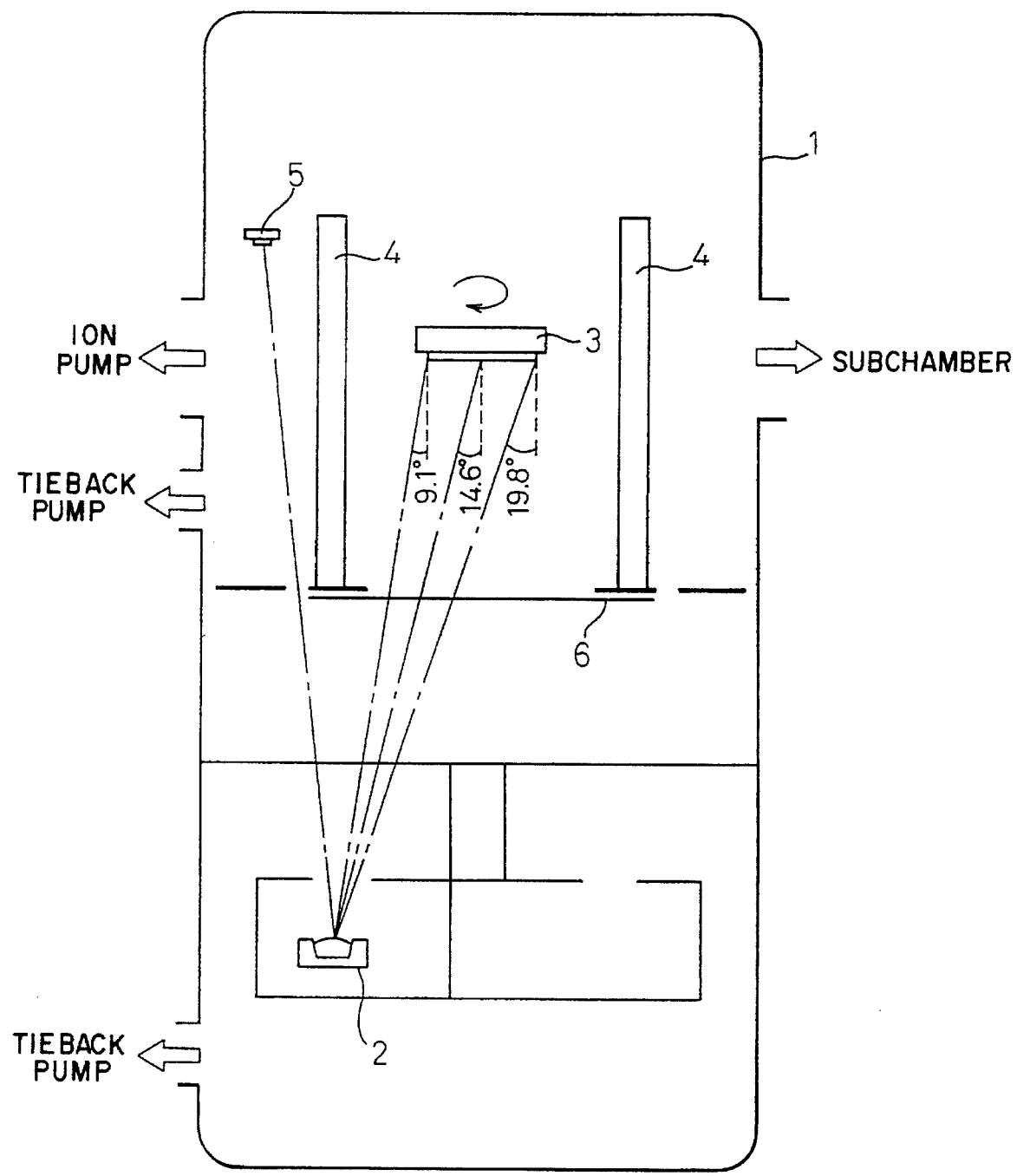
FIG. 1 shows an apparatus for carrying out a process according to the present invention, in a sectional view.

The present invention uses an Si, GaAs or other substrate, including those having a polysilicon, aluminum, TiN or other conducting film provided thereon. The insulating film according to the present invention is an $SiO_2$, PSG, SOG, or other insulating film. The metal film is made of Al, Ti, or other metal.

Preferably, the substrate is repeatedly rotated in a plane perpendicular to the normal at an angle interval of 180 deg while either the metal molecular beam is irradiated at a fixed incident angle during the deposition or the deposition is interrupted. This enables a metal film to be deposited with a uniform thickness over the substrate. In this case, preferably the rotation of the substrate is carried out at a time interval of less than a time required to provide a deposited film thickness of 400 Å. This enables a metal film to be deposited by repeated depositions of thin films and thereby suppresses the shadow effect encountered in the deposition of a thick film.

Preferably, plural metal molecular beams are irradiated at one and the same incident angle. This is advantageous in that a metal film can be deposited with a uniform thickness over a substrate without rotating the substrate and in that the irradiation by plural metal molecular beams enables a metal film to be deposited at a greater speed than the irradiation by a single beam.

Preferably, exposure of the metal film being deposited to any oxidizing gas contained in a residual gas is not more than 20 Langmuir (L). This suppresses oxidation and deterioration of the metal film and thereby facilitates the subsequent annealing. Preferably in this case, the substrate is held at a temperature of from 50° C. to 100° C. during the deposition of the metal film. At 50° C. or below, protrusions or the like form and it becomes difficult to provide a completely continuous metal film. At 100° C. or above, on the other hand, a metal film forms into balls and it becomes difficult to provide a completely continuous metal film.

Preferably, the deposited metal film is deformed by heat treatment to bury the opening, or further to planarize the surface of the metal film. Also preferably, in this case, exposure of the metal film until the deformation is completed is not more than 10 Langmuir (L). This is necessary to preserve a free surface during the mass transfer process, which is the major mechanism by which the deformation of metal film occurs. When the metal film is composed of aluminum, the substrate is preferably heat-treated at a temperature of from 110° C. to 400° C. The temperature is preferably 110° C. or higher to facilitate planarizing the metal film and burying the openings. The temperature is preferably 400° C. or lower to suppress reaction between an Al metal film and the substrate, formation of balls from the metal film, and the resulting disconnection of metal conductor wirings.

Preferably, with the metal molecular beam irradiated at a fixed incident angle, the substrate is continuously rotated in a plane perpendicular to the normal thereof during deposition of the metal film. This enables a metal film to be deposited with a uniform thickness over the substrate. Preferably, the rotation is performed at a speed such that one cycle is completed before the deposited thickness reaches 800 Å. This allows a metal film to be deposited by repeated depositions of thin films at a high deposition speed and thereby avoids shielding of the metal molecular beam that otherwise occurs in the deposition of a single thick film at a low deposition speed.

After various studies including trial and error, the inventors have noted that metal molecules in a beam form are advantageously introduced onto a deposition substrate with a controlled angle of the beam incidence to the substrate. An insulating layer is formed on a substrate and is then etched to form an opening through which the substrate is exposed. A metal molecular beam is irradiated through the opening to deposit a metal film on the substrate within the opening, with the incident angle of the metal molecular beam being controlled within a range of 5 deg$\leq \theta \leq \tan^{-1}$ (b/2a) deg ("a" and "b" being the depth and diameter of the opening, respectively) relative to the normal of the substrate surface. The inventors have found that this control provides uniform irradiation of a metal molecular beam in the opening even when the opening has a large aspect ratio. As a result, formation of an overhang at the opening top is prevented and a continuous metal film is formed in the opening. It is also possible that a deposited metal film is deformed by annealing to bury the opening thereby effecting surface planarization. Moreover, the present invention advantageously uses a sputtering method, which is not sensitively affected by the surface condition of a substrate, and enables the production cost to be reduced relative to a process using a CVD method.

The principle and operation of the present invention will now be described in detail below. Metal particles generated by evaporation or other procedure have a large mean free path when released into a high vacuum space, because the probability of collision of the released metal particles against the residual gas molecules is low and the kinetic energy loss due to dissipation by collision is small. Scattering by the collision is also avoided, so that the metal particles are conducted in the direction determined on their release. Therefore, the incident angle to a deposition substrate is readily controlled by collimating the evaporated and released metal molecules into a beam and irradiating the beam on to the substrate.

To bury up the inside space of a viahole by deformation of a metal film caused by annealing, the thus-deformed metal film must continuously cover the substrate surface in the vicinity of the viahole and the side wall and bottom of the viahole. To provide such a deformed metal film, it is essential that a deposited metal is prevented from forming an overhang at the viahole top so as to facilitate introduction of the metal particles into the viahole. To this end, it is necessary to eliminate the metal particles coming at obtuse angles relative to the normal of the substrate surface. This is achieved by the present invention by using a metal molecular beam and controlling the incident angle of the beam so as to prevent metal particles from approaching at obtuse angles relative to the normal of the substrate surface.

EXAMPLE

An example according to the present invention will now be described below with reference to the attached drawings.

FIG. 1 schematically illustrates an apparatus for producing a semiconductor device by using an Al molecular beam to effect deposition according to the present invention. FIG. 1 shows the incident angles of a beam irradiated from an electron beam gun 2 disposed in position in a chamber 1, adapted for burying viaholes having a diameter of 0.57 μm and a depth of 1.1 μm. A substrate 3 is surrounded an LN$_2$ shroud 4 to exclude any molecular beams which reflect off the inner wall of the chamber 1 and would otherwise arrive at the substrate 3 at desirable incident angles. During deposition, the substrate 3 is rotated, or rotated in directions repeatedly reversed every 180 deg, in a plane perpendicular to the normal thereof to ensure deposition of the Al molecules entirely on the side walls and bottoms of the viaholes so that the deposited Al forms a continuous film covering the substrate 3 in the vicinity of the viaholes and the side walls and bottoms of the viaholes. The reversion is preferably effected frequently to avoid interruption of the deposition of Al due to the shadow effect. In this example, the reversion is effected at every 400 Å deposition. A monitor 5 detects the deposition rate of Al and the detected value is used to control an electron beam, thereby controlling the deposition speed to a selected value. A shutter 6 interrupts the electron beam to stop deposition.

Figure 2A:
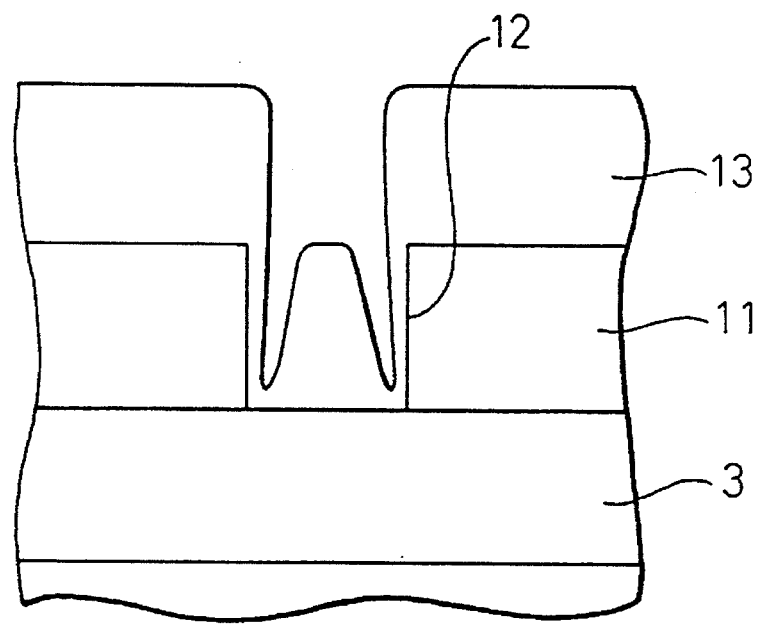
FIGS. 2 (a) and 2(b) show step (a) of depositing a continuous metal film in a viahole and step (b) of buring the viahole by annealing after deposition, respectively, in sectional views.
Figure 2B:
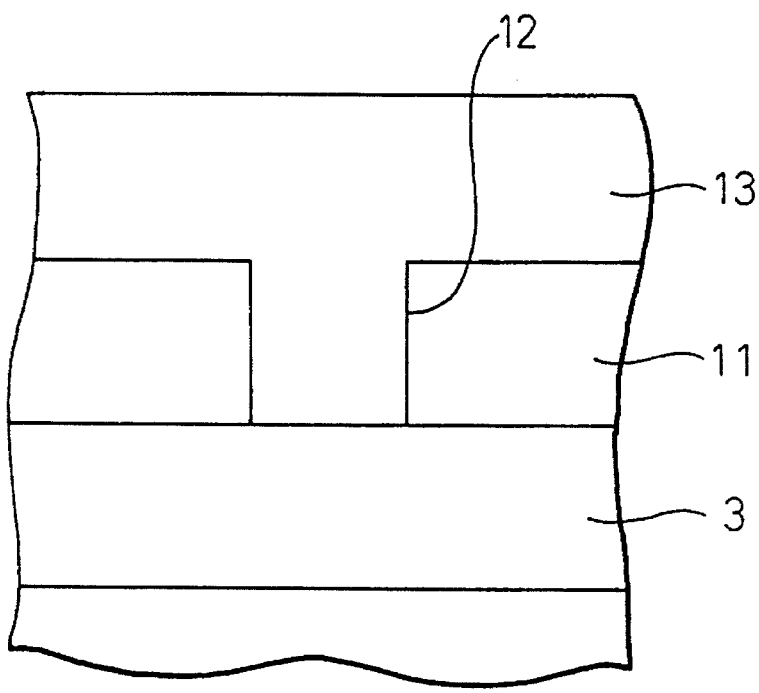

FIGS. 2(*a*) and 2(*b*) show a process sequence according to an embodiment of the present invention. The numerals denoting the members correspond to those shown in FIG. 1. An insulating film 11 of SiO$_2$ or the like is formed on the substrate 3 of Si or the like. A viahole 12 is formed by etching the insulating film 11 to expose the substrate 3 therethrough. A conductor layer 13 of Al or the like is in contact with the substrate 3 through the viahole 12 in the insulating film 11. FIG. 2(*a*) shows a product obtained by depositing the Al conductor layer 13 on the substrate 3 being rotated in repeatedly reversed directions in the apparatus shown in FIG. 1. FIG. 2(*b*) shows a product obtained by annealing the deposited Al conductor layer 13 with the vacuum maintained to bury the viahole 12 and planarize the Al conductor layer 13.

The same result was obtained when the rotation was continued in the same direction. In this case, the rotation speed must be determined in accordance with the deposition speed. Usually, the rotation covers 180 deg while the deposition amounts to 400 Å.

This example describes a process in which deposition was effected by reversal rotations followed by annealing, for burying and planarization, under the following conditions.

The process conditions included a base vacuum of $7 \times 10^{-11}$ Torr achieved before deposition, a vacuum of $8 \times 10^{-9}$ to $3 \times 10^{-8}$ Torr maintained during deposition, a deposition speed or rate of 0.8 Å/sec, a vacuum of $8 \times 10^{-11}$ to $9 \times 10^{-10}$ Torr maintained during annealing, and an annealing temperature of 200° C.

During deposition, the composition and partial pressures of the residual gas were checked by a mass-spectrometer. The result showed that the sum of the partial pressures of oxidizing components of the residual gas detected during deposition was $1 \times 10^{-9}$ Torr or less and the exposure occurring during deposition was 20 L or less. The sum of the partial pressures of oxidizing components detected before and during annealing was $1 \times 10^{-10}$ Torr, so that the exposure occurring after deposition to completion of annealing was suppressed to 10 L or less.

The substrate was held at 70° C. during deposition. If the substrate is held at below 50° C., some crystals grow into protrusions during deposition and undesirably enhance the shadow effect. On the other hand, substrate temperatures of above 100° C. facilitate agglomeration during deposition to form islands and prevent formation of a continuous film.

In this example, an SiO$_2$ insulating film 11 is formed on the substrate 3, the SiO$_2$ insulating layer 11 is etched to form an opening 12 through which the substrate 3 is exposed, and a metal (Al) molecular beam is irradiated through the opening 12 to deposit an Al metal film 13, with an incident angle θ of the metal molecular beam as shown in FIG. 1, so that a metal film can be uniformly deposited in the opening 12 even when the opening has a large aspect ratio of 1.9. This suppresses the formation of an overhang of the metal film at the top of the opening 12 and provides a continuous metal film 13 in the opening. The deposited metal film is then annealed and thereby is deformed to bury the opening 12 and effect surface planarization. Moreover, the production cost is also reduced in comparison with a CVD process, which is susceptible to the conditions of the substrate surface.

The present invention has an advantage that, even when the viaholes have an increased aspect ratio, the formation of an overhang of a metal film at the viahole top is suppressed, a continuous metal film is provided in the viahole, and the deposited metal film is annealed to induce a mass transfer for burying the viahole and effecting planarization.

I claim:

1. A process of producing a semiconductor device, comprising the steps of:

forming an insulating film on a substrate;

etching said insulating film to form an opening through which said substrate is exposed; and directing a metal molecular beam, which is a collimated beam of metal incident upon a surface of said substrate, through said opening to deposit a metal film on said substrate, said metal molecular beam being directed at an incident angle θ within a range of 5 degrees $\leq \theta \leq$ tan$^{-1}$ (b/2a) degrees, "a" and "b" being the depth and diameter of the opening, respectively, relative to the normal of the substrate.

2. A process according to claim 1, wherein said substrate is repeatedly rotated in a plane perpendicular to the normal at an angle interval of 180 degrees while one of: (a) said metal molecular beam is directed at a fixed incident angle during said deposition and (b) said deposition is interrupted.

3. A process according to claim 2, wherein said rotation of said substrate is carried out at a time interval of less than a time required to provide the deposited metal film with a thickness of 400 Å.

4. A process according to claim 1, wherein a plurality of metal molecular beams are directed at one and the same incident angle.

5. A process according to claim 1, wherein exposure of said metal film being deposited to any oxidizing gas contained in a residual gas is not more than 20 Langmuir (L) during the deposition.

6. A process according to claim 1, wherein said substrate is held at a temperature of from 50° C. to 100° C. during said deposition of said metal film.

7. A process according to claim 1, wherein said deposited metal film is deformed by heat treatment to bury said opening, or to further planarize the surface of said metal film.

8. A process according to claim 7, wherein exposure to any oxidizing gas contained in a residual gas during the heat treatment of said metal film until said deformation is completed is not more than 10 Langmuir (L).

9. A process according to claim 7 or 8, wherein said metal film is composed of aluminum and said substrate is heat-treated at a temperature of from 110° C. to 400° C.

\* \* \* \* \*